US012727523B2

(12) United States Patent
Lu et al.

(10) Patent No.: US 12,727,523 B2
(45) Date of Patent: Sep. 1, 2026

(54) VARIED BALL BALL-GRID-ARRAY (BGA) PACKAGES

(71) Applicant: Intel Corporation, Santa Clara, CA (US)

(72) Inventors: Xiao Lu, Chandler, AZ (US); Jiongxin Lu, Chandler, AZ (US); Christopher Combs, Portland, OR (US); Alexander Huettis, Aloha, OR (US); John Harper, Chandler, AZ (US); Jieping Zhang, Mesa, AZ (US); Nachiket R. Raravikar, Gilbert, AZ (US); Pramod Malatkar, Chandler, AZ (US); Steven A. Klein, Chandler, AZ (US); Carl Deppisch, Tempe, AZ (US); Mohit Sood, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/418,154

(22) Filed: Jan. 19, 2024

(65) Prior Publication Data

US 2024/0162134 A1 May 16, 2024

Related U.S. Application Data

(63) Continuation of application No. 16/575,307, filed on Sep. 18, 2019, now Pat. No. 11,916,003.

(51) Int. Cl.
*H10W 90/00* (2026.01)
*B23K 3/06* (2006.01)
(Continued)

(52) U.S. Cl.
CPC ......... *H10W 90/401* (2026.01); *B23K 3/0623* (2013.01); *H10W 70/611* (2026.01); *H10W 70/685* (2026.01); *H10W 70/688* (2026.01)

(58) Field of Classification Search
None
See application file for complete search history.

(56) References Cited

U.S. PATENT DOCUMENTS 4,941,929 A * 7/1990 Tecle .................... B23K 35/36 148/26
5,539,153 A 7/1996 Schwiebert
(Continued)

FOREIGN PATENT DOCUMENTS

JP H 10233465 9/1989
JP 1997045807 2/1997
(Continued)

OTHER PUBLICATIONS

Office Action from Malaysian Patent Application No. PI2020003481, mailed May 2, 2023, 6 pgs.
(Continued)

*Primary Examiner* — Nicholas J Tobergte
(74) *Attorney, Agent, or Firm* — Schwabe, Williamson & Wyatt, P.C.

(57) ABSTRACT

Embodiments disclosed herein include electronic packages. In an embodiment, the electronic package comprises a first substrate; a second substrate; and an array of interconnects electrically coupling the first substrate to the second substrate. In an embodiment, the array of interconnects comprises first interconnects, wherein the first interconnects have a first volume and a first material composition, and second interconnects, wherein the second interconnects have a second volume and a second material composition, and wherein the first volume is different than the second volume and/or the first material composition is different than the second material composition.

50 Claims, 9 Drawing Sheets

(51) Int. Cl.

| | |
|---|---|
| ***H10W 70/60*** | (2026.01) |
| ***H10W 70/67*** | (2026.01) |
| ***H10W 70/685*** | (2026.01) |

(56) References Cited

U.S. PATENT DOCUMENTS

| | | | | |
|---|---|---|---|---|
| 6,350,669 | B1 | 2/2002 | Pu | |
| 6,550,665 | B1 | 4/2003 | Parrish | |
| 7,145,226 | B2 | 12/2006 | Kumamoto | |
| 7,425,468 | B2 | 9/2008 | Wang | |
| 7,759,785 | B2 | 7/2010 | Corisis | |
| 8,436,470 | B2 | 5/2013 | Suh | |
| 9,257,405 | B2 | 2/2016 | Sidhu | |
| 9,385,098 | B2 | 7/2016 | Zhang | |
| 9,662,730 | B2 | 5/2017 | Hattori | |
| 10,141,280 | B2 | 11/2018 | Chen | |
| 2004/0124540 | A1* | 7/2004 | Chen | H05K 3/3436 257/E23.021 |
| 2006/0272850 | A1 | 12/2006 | Morimoto | |
| 2008/0115968 | A1 | 5/2008 | Suh | |
| 2008/0165513 | A1 | 7/2008 | Inoue | |
| 2008/0251913 | A1 | 10/2008 | Inomata | |
| 2009/0080169 | A1 | 3/2009 | Webster | |
| 2011/0163440 | A1 | 7/2011 | Theuss | |
| 2012/0000963 | A1 | 1/2012 | Park | |
| 2012/0225522 | A1* | 9/2012 | Zhao | H01L 23/49816 438/107 |
| 2013/0214410 | A1* | 8/2013 | Khan | H01L 23/49833 257/738 |
| 2013/0264708 | A1* | 10/2013 | Hiwatashi | H01L 23/49816 257/738 |
| 2014/0151860 | A1 | 6/2014 | Nakamura | |
| 2014/0319682 | A1 | 10/2014 | Sidhu | |
| 2017/0012081 | A1* | 1/2017 | Shen | H01L 24/81 |
| 2017/0053858 | A1* | 2/2017 | Krajniak | B23K 35/025 |
| 2017/0170140 | A1* | 6/2017 | Nah | H01L 24/11 |
| 2018/0233473 | A1* | 8/2018 | Fukuhara | B23K 35/264 |
| 2019/0044047 | A1 | 2/2019 | Elsherbini | |
| 2020/0058611 | A1* | 2/2020 | Lin | H01L 23/49833 |
| 2021/0118785 | A1 | 4/2021 | Lin | |

FOREIGN PATENT DOCUMENTS

| | | |
|---|---|---|
| JP | 2000031318 | 1/2000 |
| JP | 2000299407 | 10/2000 |
| JP | 2004165511 | 6/2004 |
| JP | 2005011921 | 1/2005 |
| JP | 2006310619 | 11/2006 |
| JP | 2012099642 | 5/2012 |
| KR | 20120098844 | 5/2012 |
| KR | 20130114618 | 10/2013 |
| TW | 201530671 | 8/2015 |
| WO | WO 2019066987 | 4/2019 |

OTHER PUBLICATIONS

Office Action from Japan Patent Application No. 2020-104505, mailed Oct. 15, 2024, 14 pgs.

Office Action from Taiwan Patent Application No. 109120607, mailed Jan. 7, 2025, 11 pgs.

Office Action from Japan Patent Application No. 2020-104505, mailed May 21, 2024, 18 pgs.

Office Action from Taiwan Patent Application No. 109120607, mailed Jun. 24, 2024, 25 pgs.

Office Action from Taiwan Patent Application No. 109120607, mailed Jul. 17, 2025, 4 pgs.

Office Action from Korean Patent Application No. 10-2020-0077536, mailed Sep. 23, 2025, 9 pgs.

Notice of Allowance from Taiwan Patent Application No. 109120607, mailed Oct. 23, 2025, 3 pgs.

Search Report from Malaysian Patent Application No. P12020003481, mailed Apr. 24, 2025, 3 pgs.

Final Office Action from Japan Patent Application No. 2020-104505, mailed Apr. 1, 2025, 27 pgs.

Office Action from India Patent Application No. 202044026971, mailed May 31, 2022, 6 pgs.

Office Action from India Patent Application No. 202445022106, mailed Feb. 16, 2026, 7 pgs.

Office Action from Malaysian Patent Application No. PI2020003481, mailed Apr. 17, 2026, 2 pgs.

Office Action from Japan Patent Application No. 2020-104505, mailed Jun. 23, 2026, 4 pgs.

Office Action from Korean Patent Application No. 10-2020-0077536, mailed Jul. 8, 2026, 4 pgs.

* cited by examiner

VARIED BALL BALL-GRID-ARRAY (BGA) PACKAGES

CROSS-REFERENCE TO RELATED APPLICATIONS

This application is a continuation of U.S. patent application Ser. No. 16/575,307, filed on Sep. 18, 2019, the entire contents of which is hereby incorporated by reference herein.

TECHNICAL FIELD

Embodiments of the present disclosure relate to semiconductor devices, and more particularly to interconnect architectures that include first solder balls and second solder balls to provide improved yield in assembly processes.

BACKGROUND

The dynamic warpage of flip chip ball-grid-array (BGA) packages induces a variety of defects during surface mount technology (SMT) processes. FIG. 1 is a cross-sectional illustration of a BGA package 100 that illustrates examples of some of the typical defects. The BGA package 100 may include a board 105 with a package substrate 115 attached to the board 105 by interconnects 125 between pads 107 and 117. A die 120 may be attached to the package substrate 115. As shown, warpage of the package substrate 115 may result in several of the defects. Defect 126 illustrates solder ball bridging (SBB). SBB defects occur when the solder balls are compressed, resulting in the interconnect width extending beyond tolerances and coalesce with a neighboring interconnect. Compression may be the result of increased warpage due to thinner substrate layer count, package shape variation due to the presence of large and thick stiffeners, and/or increased weight per bump due to the increased die size and package form factor. Warpage may also lead to other defects. For example, defect 127 is a head on pillow (HoP) defect that results from the solder ball not coalescing with the solder paste. Defect 128 is a non-contact open (NCO), and defect 129 is a non-wet open (NWO).

Warpage may be addressed by adding stiffeners onto the package substrate. However, stiffeners (and their necessary keep out zones) occupy valuable real estate on the top side of the package. In order to account for the warpage, stencil design optimization to tailor paste volumes to control solder volumes at different locations has been proposed. However, stencil designs are approaching the printing process limits to further reduce paste volume to prevent SBBs. Another proposed option is to use land side components (LSCs) on the backside of the package as a stand-off during SMT to prevent SBBs. However, the choice of LSC height is limited and are often too short to function as a stand-off, or are too tall and induce NCO defects. Also, height variations of LSCs between suppliers is large and not easily controllable. Another option is to use copper bumps or pillars on the motherboard to serve as a stand-off during SMT. However, this requires SMT process changes to attach the pillars using pick and place equipment, as well as occupying the constrained package and mother board real estate.

EMBODIMENTS OF THE PRESENT DISCLOSURE

Figure 1:
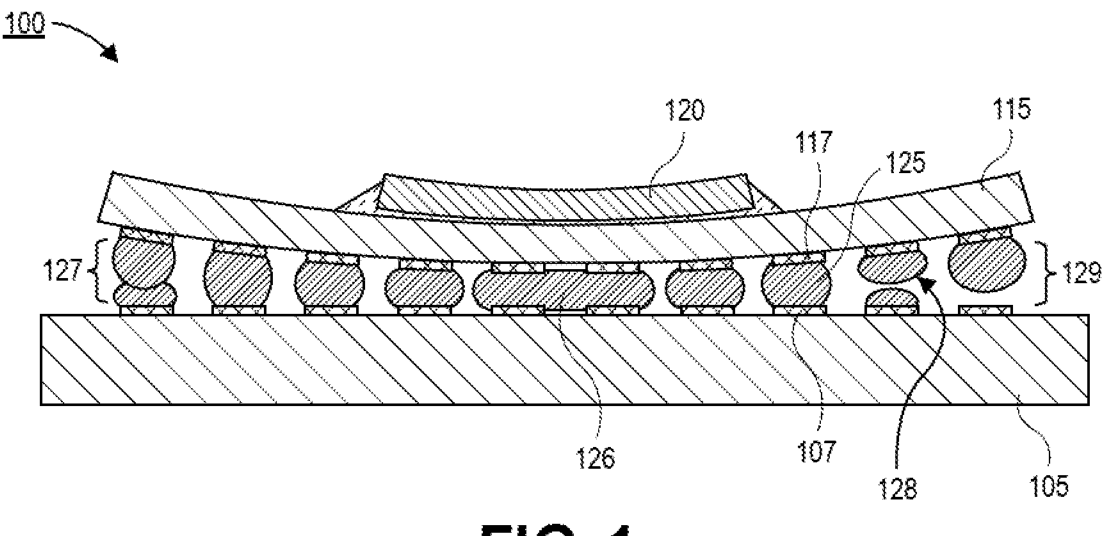
FIG. 1 is a cross-sectional illustration of an electronic package with a plurality of defects arising from the warpage of the package substrate.

Described herein are electronic packages with interconnect architectures that include first solder balls and second solder balls to provide improved yield in assembly processes, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, warpage is a significant problem in the assembly of packages. Particularly, warpage of the package substrate results in a variety of interconnect defects during surface mount technology (SMT) processes. One of the typical defects observed is solder bump bridging (SBB) that occurs when the solder balls are collapsed beyond tolerances. Accordingly, embodiments disclosed herein use variable ball architectures to reduced or eliminate SMT defects.

Embodiments include the use of first solder balls for the majority of the interconnects and second solder balls that are strategically placed to minimize defects. The second solder balls may differ from the first solder balls with respect to volume and/or composition. Composition differences may include different solders (for different reflow temperatures), as well as the use of cored solder balls (i.e., a core that remains substantially solid during reflow and that is surrounded by a reflowable solder). Second solder balls, that include different solder metallurgy with different melting and collapse behavior during SMT reflow, function as a collapse limiter to provide improved SBB margins while maintaining head on pillow (HoP), non-contact open (NCO), and non-wet open (NWO) margins.

The use of such varied ball architectures provides significant SMT benefits. For example, yield is improved and the process is more tolerant to assembly/test variations and handling induced package warpage variations. Additionally, fewer solder paste stencil revisions are needed to provide high yielding processes. In embodiments that utilize cored solder balls, the size of the core can be chosen to provide stand-offs with tight tolerances. Varying the size of the core can also be used to control the stand-off height needed for different package architectures. Furthermore, the use of cored solder balls does not occupy additional real estate of the package and mother board since the cored balls can function electrically, so long as reliability and performance requirements are met. Alternatively, the cored solder balls may be populated at non-critical-to-function (NCTF) locations, redundant power/ground locations, and/or non-connect locations designated to each package. Furthermore, due to the improved accommodation of warpage, embodiments disclosed herein may eliminate the need for stiffeners (or relax the stiffener dimensions) to control package warpage for addressing SMT challenges.

Figure 2A:
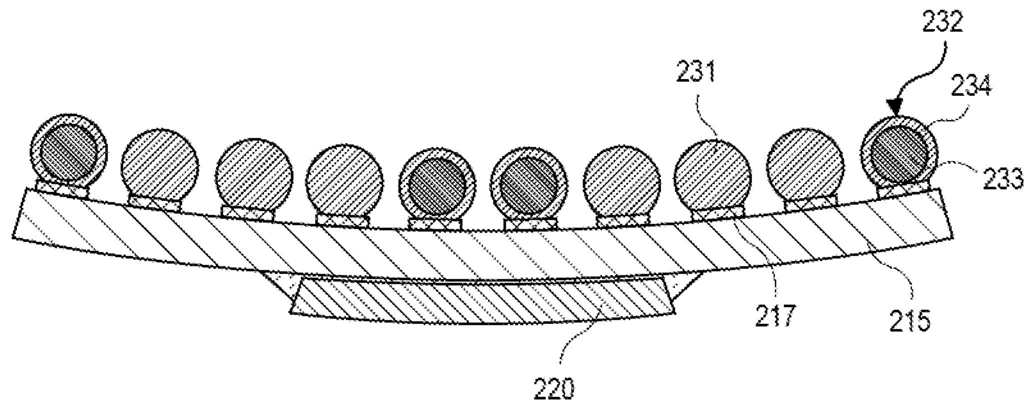
FIG. 2A is a cross-sectional illustration of a package substrate with first solder balls and second solder balls, in accordance with an embodiment.
Figure 2B:
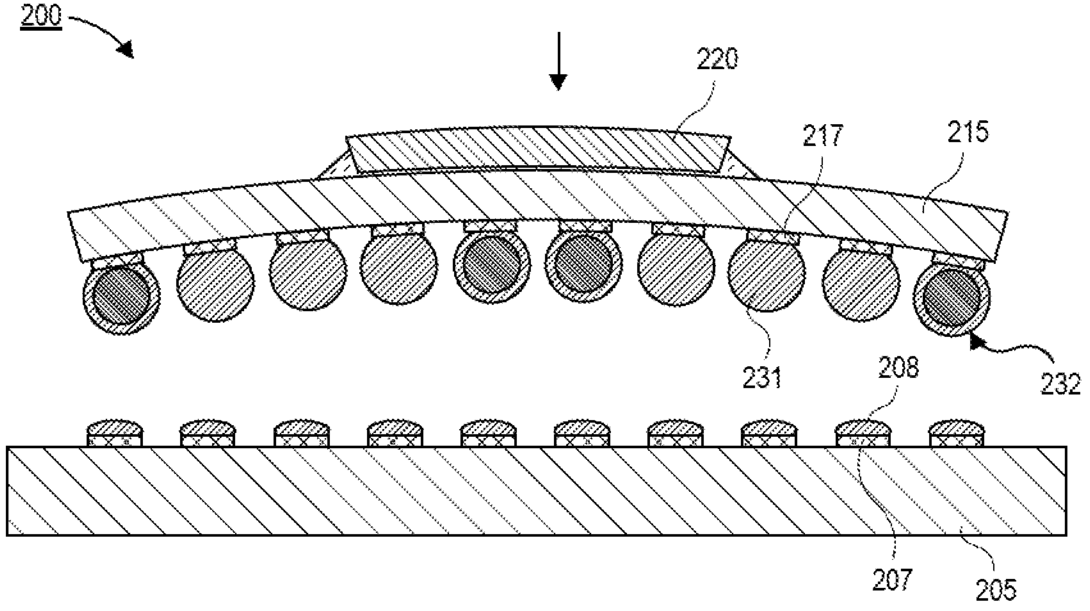
FIG. 2B is a cross-sectional illustration of the package substrate being attached to a board, in accordance with an embodiment.
Figure 2C:
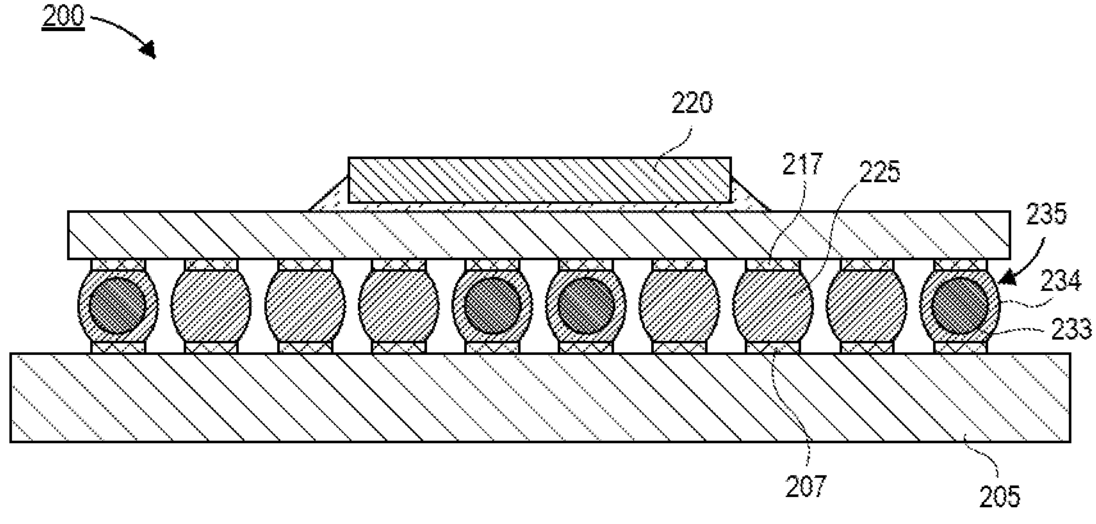
FIG. 2C is a cross-sectional illustration of an electronic package with interconnects formed from the first solder balls and the second solder balls, in accordance with an embodiment.

Referring now to FIGS. 2A-2C, a series of cross-sectional illustrations depict a process for attaching a first substrate to a second substrate using a variable ball architecture is shown, in accordance with an embodiment. In a particular embodiment, the process may be an SMT process. That is, the first substrate may be a package substrate, and the second substrate may be a board (e.g., a printed circuit board (PCB)). However, it is to be appreciated that similar attachment processes that use an array of solder interconnects with variable ball architectures may be used to attach any two substrates together.

Referring now to FIG. 2A, a cross-sectional illustration of a first substrate 215 is shown, in accordance with an embodiment. In a particular embodiment, the first substrate 215 may be an organic package substrate. For example, the first substrate 215 may comprise a plurality of laminated organic layers with (or without) a core. In an embodiment, conductive features (not shown) may be embedded in the first substrate 215 to provide electrical coupling between pads 217 and a component 220. For example, the component 220 may be a semiconductor die (e.g., a processor die, a memory die, etc.). While a single component 220 is shown on the first substrate 215, it is to be appreciated that any number of components 220 may be coupled to the first substrate 215.

In an embodiment, the first substrate 215 may exhibit warpage. For example, the corners of the first substrate 215 may bend away from the component 220. That is, the surface of the first substrate 215 on which the pads 217 are located may be concave, and the surface of the first substrate 215 on which the component 220 is located may be convex.

In an embodiment, a solder ball 231/232 may be positioned on each of the pads 217. Embodiments include varied solder balls 231/232. For example, a first solder ball 231 or a second solder ball 232 may be disposed over each of the pads 217. The first solder balls 231 are different than the second solder balls 232. For example, the first solder balls 231 may have a first volume and a first composition, and the second solder balls 232 may have a second volume and a second composition. In an embodiment, the first volume is different than the second volume, the first composition is different than the second composition, or the first and second volumes are different from each other and the first and second compositions are different from each other.

In the embodiment illustrated in FIG. 2A, the first solder balls 231 comprise a uniform composition and the second solder balls 232 are cored solder balls. That is, the second solder balls 232 comprise a core 233 and solder 234 surrounding the core 233. The core 233 may be a material that remains substantially solid during a reflow that melts the solder 234. In an embodiment, the core 233 may be a metallic material, such as copper or nickel. Other embodiments may include a core 233 that is a polymeric material. The use of a polymeric core 233 may improve compliance of the second solder balls 232 and allow for improved reliability.

Since the core 233 does not substantially melt, the core 233 may function as a stand-off during an SMT process (or any other reflow process). Accordingly, the diameter of the core 233 may be chosen to provide a desired stand-off height during an SMT process. In an embodiment, the core 233 may have a diameter that is approximately 300 μm or less, approximately 250 μm or less, or approximately 100 μm or less.

In an embodiment, the ball attach of the first solder balls 231 and the second solder balls 232 onto the pads 217 of the first substrate 215 may be implemented with a pick-and-place tool. In a particular embodiment, the pick-and-place tool is configured to dispense both the first solder balls 231 and the second solder balls 232. After the ball attach of the first solder balls 231 and the second solder balls 232, a ball attach reflow may be implemented.

In an embodiment, the second solder balls 232 may be selectively placed at locations that will provide improved assembly yield. Generally, the second solder balls 232 may be placed at locations where the risk of SBB is high. For example, high risk for SBB typically occurs at corners of the first substrate 215 and at the center of the first substrate 215. However, other locations may be chosen for second solder balls 232 depending on the shape of the first substrate 215 and the dynamic warpage behavior during attachment to a second substrate. A more detailed description of the locations where second solder balls 232 may be positioned is provided below with respect to FIGS. 4A-4D.

Referring now to FIG. 2B, a cross-sectional illustration of an electronic package 200 is shown, in accordance with an embodiment. The electronic package 200 is shown during an attachment process as the solder balls 231/232 of the first substrate 215 are brought into contact with a second substrate 205, as indicated by the arrow. Particularly, the solder balls 231/232 are brought into contact with solder paste 208 that is over pads 207 on the second substrate 205. In an embodiment, the second substrate 205 may be a board, (e.g., mother board, PCB, or the like). In such embodiments, the attachment process may be an SMT process.

In some embodiments, the attachment process may also include the application of force (e.g., applied by a pick-and-place tool used to attach the first substrate 215 to the second substrate 205). Application of force may be used to decrease warpage during the SMT process. Without the inclusion of second solder balls 232, the application of force would collapse the solder balls 231 beyond tolerances and result in SBB defects. In embodiments disclosed herein, however, allow for the extra application of force because the second solder balls 232 provide a uniform stand-off height and prevent the collapse of solder balls 231/232.

Referring now to FIG. 2C, a cross-sectional illustration of the electronic package 200 after a reflow during the attachment process has been completed is shown, in accordance with an embodiment. In an embodiment, the reflow process causes the first solder balls 231 to coalesce with the paste 208 to form first interconnects 225, and causes the solder 234 of the second balls 232 to coalesce with the paste 208 to form second interconnects 235. Since the first interconnects 225 and the second interconnects 235 are formed with different solder balls 231/232, the first interconnects 225 are different than the second interconnects 235. For example, in the case where the second solder balls 232 include cored solder balls, an entire volume of the first interconnects 225 may be substantially solder and a volume of the second interconnects 235 may comprise the core 233 and solder 234.

Figure 3A:
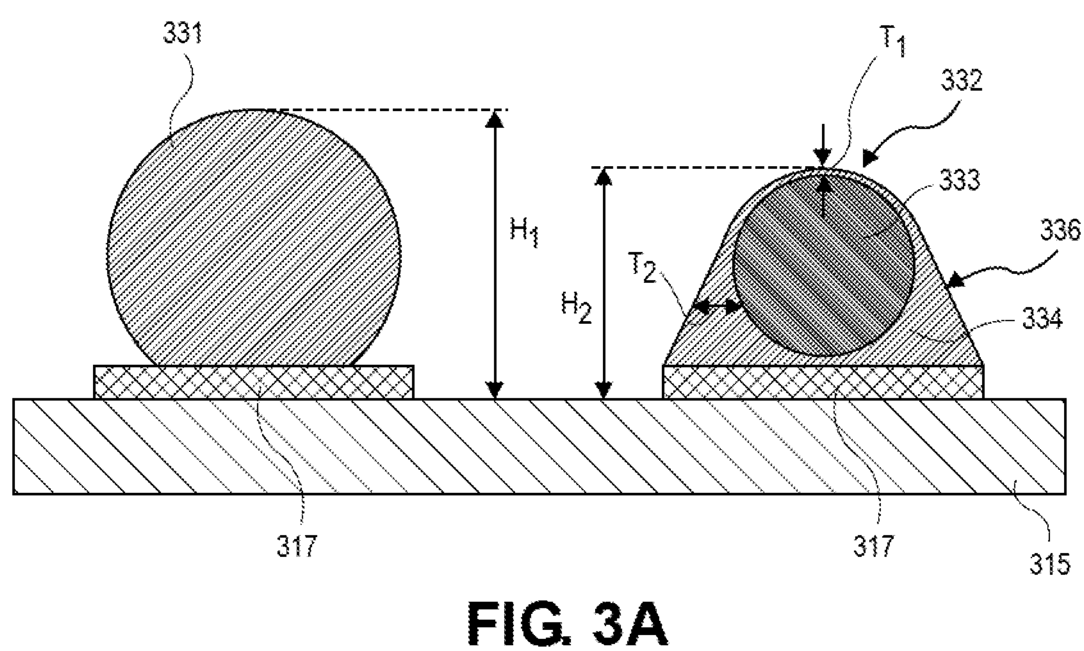
FIG. 3A is a cross-sectional illustration of a first solder ball and a second solder ball after ball attach (BA) reflow, in accordance with an embodiment.

Referring now to FIG. 3A, a zoomed in cross-sectional illustration of the profile of a first solder ball 331 and a second solder ball 332 after ball attach reflow is shown, in accordance with an embodiment. The first solder ball 331 and the second solder ball 332 may be reflown over pads 317 on a first substrate 315. In the illustrated embodiment, the second solder ball 332 is a cored solder ball that comprises a core 333 and solder 334 surrounding the core 333.

As shown, subsequent to reflow, the profile of the second solder ball 332 is clearly distinguishable from that of the first solder ball 331. One difference between the first solder ball 331 and the second solder ball 332 may be that the first solder ball 331 has a first height $H_1$ that is greater than a second height H2 of the second solder ball 332. In an embodiment, the first solder ball 331 may comprise a substantially circular cross-section with a flat bottom interfacing with the pad 317. In contrast, the second solder ball 332 may have a fillet 336 extending towards the pad 317 from a rounded top surface. The solder 334 may therefore have a non-uniform thickness surrounding the core 333. For example, a first thickness $T_1$ of the solder 334 above the core 333 may be smaller than a second thickness $T_2$ of the solder 334 on the side of the core 333. In a particular embodiment, the first thickness $T_1$ may be between approximately 1 μm or greater.

Figure 3B:
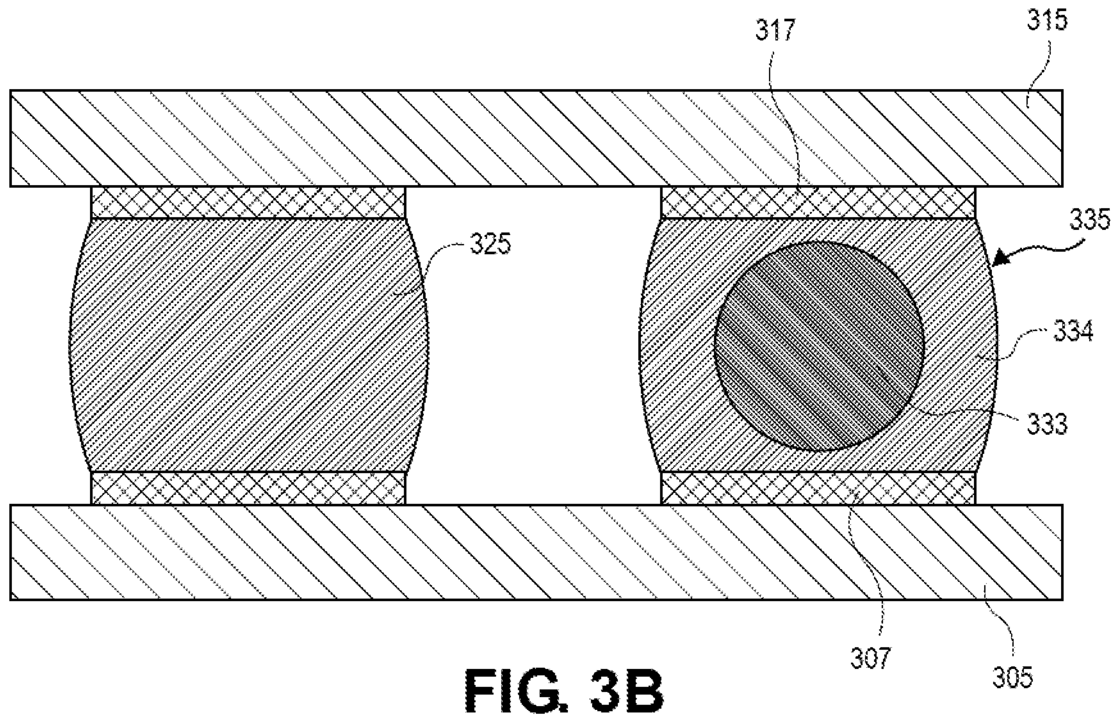
FIG. 3B is a cross-sectional illustration of a first interconnect and a second interconnect after SMT, in accordance with an embodiment.

Referring now to FIG. 3B, a zoomed in cross-sectional illustration of a first interconnect 325 and a second interconnect 335 after a reflow to attach a first substrate 315 to a second substrate 305 is shown, in accordance with an embodiment. In an embodiment, the first interconnect 325 may have a substantially uniform composition (e.g., solder), and the second interconnect 335 may have a composition that comprises solder 334 surrounding a core 333. In an embodiment, the second interconnect 335 may comprise solder 334 that completely surrounds all surfaces of the core 333. However, in other embodiments, portions of the core 333 may be in direct contact with the pad 317 of the first substrate 315 and/or the pad 307 of the second substrate 305. Since the core 333 does not melt during the reflow, the core 333 may provide a highly uniform stand-off height between the first substrate 315 and the second substrate 305. Accordingly, the core 333 in the second interconnects 335 may prevent excessive collapse of the second solder balls 332 (as well as the first solder balls 331) that may otherwise result in SBB defects.

Referring now to FIGS. 4A-4D, plan view illustrations of exemplary pin maps of a first substrate 415 are shown, in accordance with an embodiment. It is to be appreciated that the number of pins in the pin maps shown in FIGS. 4A-4D are reduced in order to simplify the Figures. That is, embodiments may include solder ball arrays that include hundreds of solder balls or thousands of solder balls, depending on the particular package. In the illustrated embodiments, the number of first solder balls 431 is greater than the number of second solder balls 432. Depending on the package architecture, the number of first solder balls 431 may be tens, hundreds, or thousands of times larger than the number of second solder balls 432. The second solder balls 432 are different than the first solder balls 431. For example, the second solder balls 432 may be cored solder balls, may be a different volume than the first solder balls 431, or may include a different solder composition than the first solder balls.

Figure 4A:
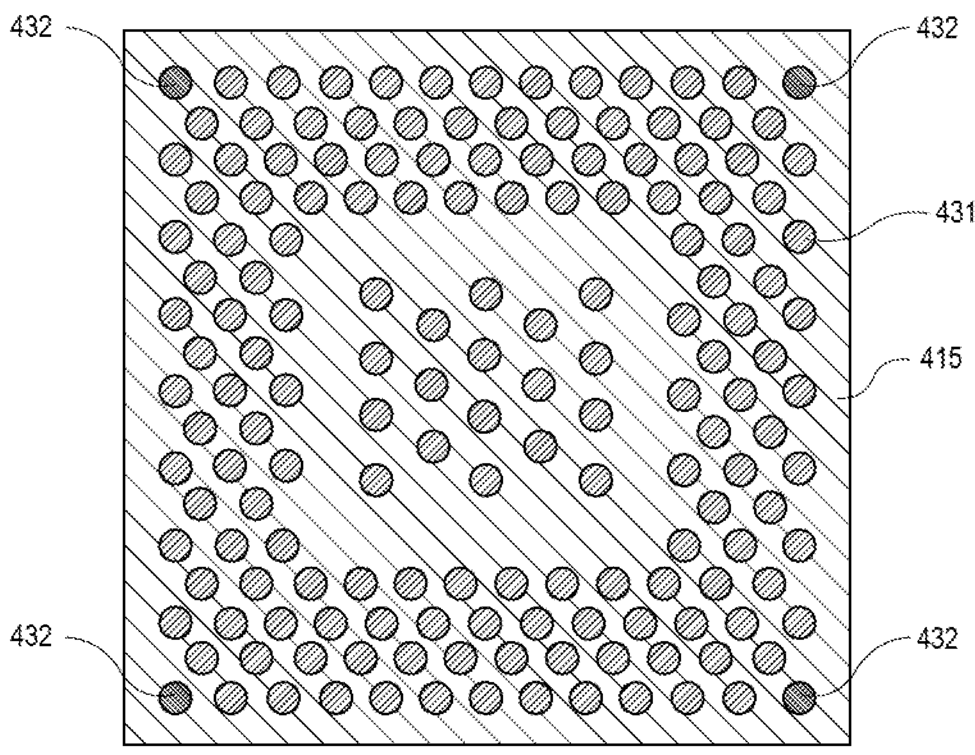
FIG. 4A is a plan view illustration of a package substrate that illustrates the pin map with second solder balls at the corners of the package substrate, in accordance with an embodiment.

Referring now to FIG. 4A, a plan view illustration of a pin map of a first substrate 415 is shown, in accordance with an embodiment. In the illustrated embodiment, second solder balls 432 are located proximate to the corner of the array of first solder balls 431. Particularly, the second solder balls 432 are shown as being the absolute corners of the array of first solder balls 431. However, it is to be appreciated that the second solder balls 432 may be located in a corner region of the array of first solder balls 431. That is, the second solder balls 432 may not be at the absolute corner of the array of first solder balls 431. In the illustrated embodiment, a second solder ball 432 is located at each corner of the array of solder balls 431. However, it is to be appreciated that not all corner regions may include a second solder ball 432 in some embodiments. Furthermore, the array of first solder balls 431 in FIG. 4A includes four corner regions. However, it is to be appreciated that the array may comprise shapes other than rectangles, and therefore, may include more than four corner regions. In such embodiments, there may be more than four second solder balls 432. Additionally, while a single second solder ball 432 is located in each corner region, it is to be appreciated that in some embodiments, a plurality of second solder balls 432 may be located in one or more of the corner regions of the array of first solder balls 431.

Figure 4B:
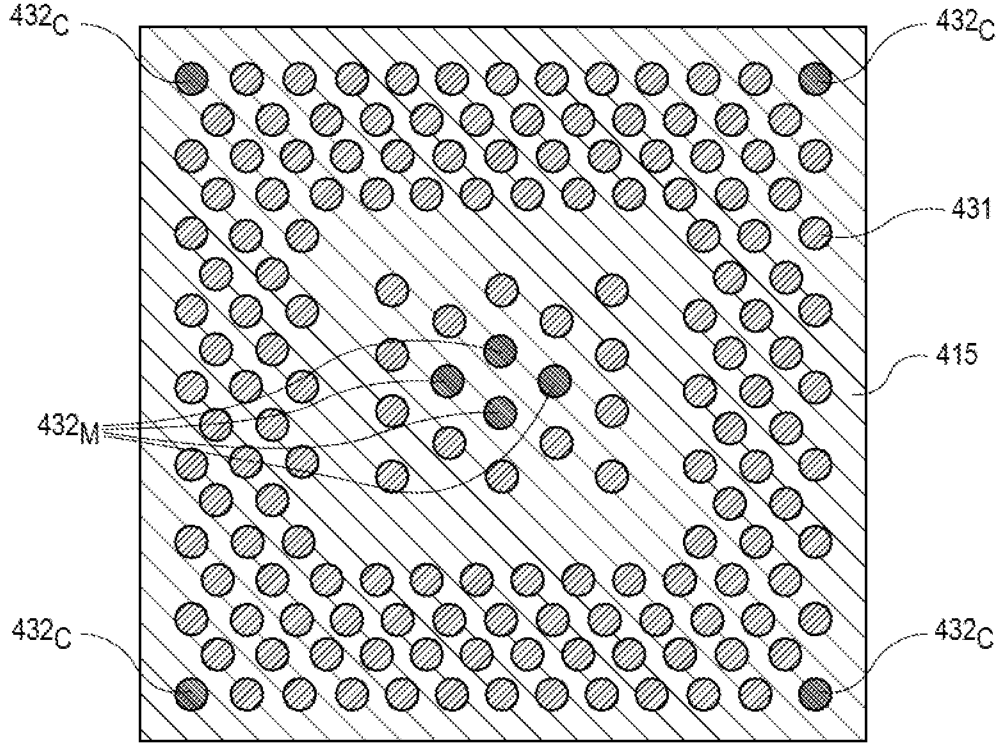
FIG. 4B is a plan view illustration of a package substrate that illustrates the pin map with second solder balls at the corners and the center of the package substrate, in accordance with an embodiment.

Referring now to FIG. 4B, a plan view illustration of a pin map of a first substrate 415 is shown, in accordance with an additional embodiment. As shown, second solder balls 432 may be populated in the corner regions and the middle of the array of first solder balls 431. For example, second solder balls 432*c* are at the corner regions and second solder balls $\mathbf{432}_M$ at the middle of the array of first solder balls 431. While four middle second solder balls $\mathbf{432}_M$ are shown, it is to be appreciated that any number (i.e., one or more) middle second solder balls $\mathbf{432}_M$ may be included in the array of first solder balls 431. Furthermore, while referred to as "middle" second solder balls $\mathbf{432}_M$ it is to be appreciated that the middle second solder balls $\mathbf{432}_M$ may be proximate to a middle of the array, and need not be exactly centered in the middle of the array of first solder balls 431. Furthermore, while middle second solder balls $\mathbf{432}_M$ and corner second solder balls 432*c* are both shown, it is to be appreciated that in some embodiments, the corner second solder balls 432*c* may be optionally omitted and only middle second solder balls $\mathbf{432}_M$ are included.

Figure 4C:
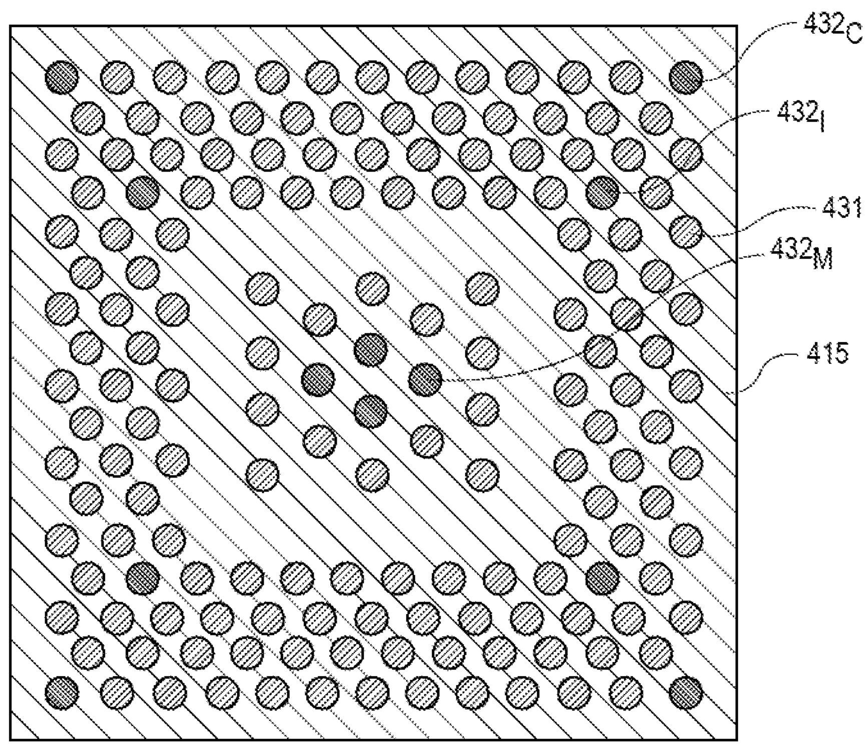
FIG. 4C is a plan view illustration of a package substrate that illustrates the pin map with second solder balls at the corners, the interior, and the center of the package substrate, in accordance with an embodiment.

Referring now to FIG. 4C, a plan view illustration of a pin map of a first substrate 415 is shown, in accordance with an additional embodiment. The pin map in FIG. 4C may be substantially similar to the pin map in FIG. 4B, with the exception that interior second solder balls $\mathbf{432}_I$ are also included. The interior second solder balls $\mathbf{432}_I$ may be populated at locations within the array that are more susceptible to SBB defects. For example, interior corners of the array of first solder balls 431 may be populated by interior second solder balls $\mathbf{432}_I$. While four interior second solder balls $\mathbf{432}_I$ are shown, it is to be appreciated that embodiments may include any number (i.e., one or more) interior second solder balls $\mathbf{432}_I$.

Figure 4D:
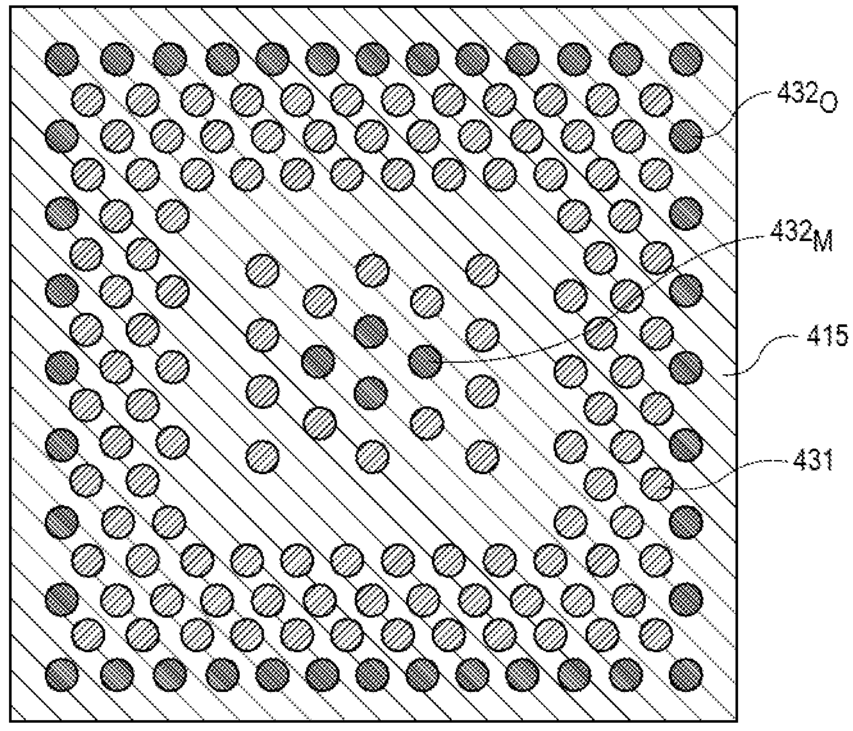
FIG. 4D is a plan view illustration of the package substrate that illustrates the pin map with the second solder balls along a perimeter and in the center of the package substrate, in accordance with an embodiment.

Referring now to FIG. 4D, a plan view illustration of a pin map of a first substrate 415 is shown, in accordance with an additional embodiment. The pin map in FIG. 4D may be substantially similar to the pin map in FIG. 4B, with the exception that the entire outer perimeter of the array of first solder balls 431 is populated by outer second solder balls 432*o*. While the entire outer perimeter includes second solder balls 432*o* in FIG. 4D, it is to be appreciated that any portion of the outer perimeter of the array of first solder balls 431 may be populated by outer second solder balls $\mathbf{432}_o$.

In the embodiments illustrated in FIGS. 4A-4D, the second solder balls 432 are positioned within the array of first solder balls 431 without consideration to changes in electrical performance. The positioning and number of second solder balls 432 is not limited when the second solder balls 432 can meet reliability and performance requirements. That is, in some embodiments, the second solder balls 432 may have an electrical performance that is similar enough to the first solder balls 431 so that they may be interchangeable. Alternatively, when the second solder balls 432 do not have the same reliability and/or performance characteristics of the first solder balls 431, the second solder balls 432 may be populated at non-critical-to-function (NCTF) locations, redundant power/ground locations, and/or non-connect locations designated to each package.

Referring now to FIGS. 5A-5D, a series of cross-sectional illustrations that depict first solder balls 531 and second solder balls 532 are shown, in accordance with various embodiments.

Figure 5A:
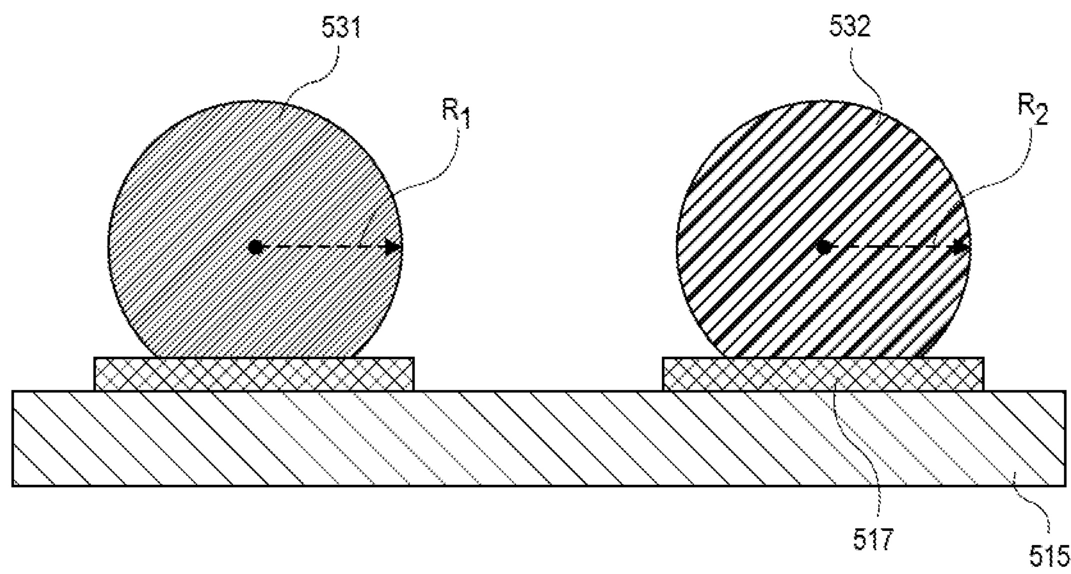
FIG. 5A is a cross-sectional illustration of a first solder ball and a second solder ball, where the first solder ball and the second solder ball have different material compositions, in accordance with an embodiment.

Referring now to FIG. 5A, a cross-sectional illustration of a first solder ball 531 and a second solder ball 532 on pads 517 on a first substrate 515 is shown, in accordance with an embodiment. The first solder ball 531 may have a first radius $R_1$ and the second solder ball 532 may have a second radius $R_2$ that is substantially the same as the first radius $R_1$. In an embodiment, the first solder ball 531 may have a first material composition and the second solder ball 532 may have a second material composition that is different than the first material composition. Accordingly, the reflow temperature (and the collapse behavior) of the first solder ball 531 may be different than that of the second solder ball 532. In a particular embodiment, the first solder ball 531 may be a SnAgCu (SAC) solder and the second solder ball 532 may be a low temperature solder (e.g., SnBi solder or the like).

Figure 5B:
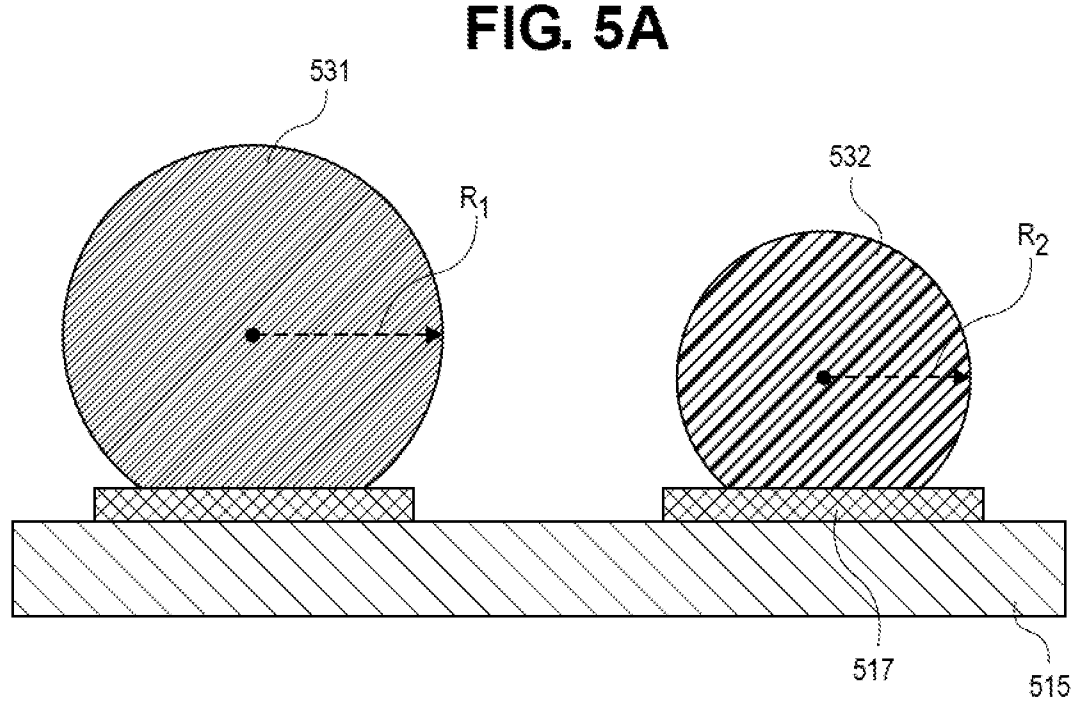
FIG. 5B is a cross-sectional illustration of a first solder ball and a second solder ball, where the first solder ball and the second solder ball have different volumes, in accordance with an embodiment.

Referring now to FIG. 5B, a cross-sectional illustration of a first solder ball 531 and a second solder ball 532 is shown, in accordance with a different embodiment. In the illustrated embodiment, the first solder ball 531 and the second solder ball 532 may have different compositions and different volumes. For example, the first solder ball 531 may have a volume defined by a first radius $R_1$ that is larger than a second radius $R_2$ of the second solder ball 532. While shown as having different compositions (i.e., the shadings are different), the first solder ball 531 may optionally have the same composition as the second solder ball 532 so long as there is at least some difference (e.g., the volumes are different).

Figure 5C:
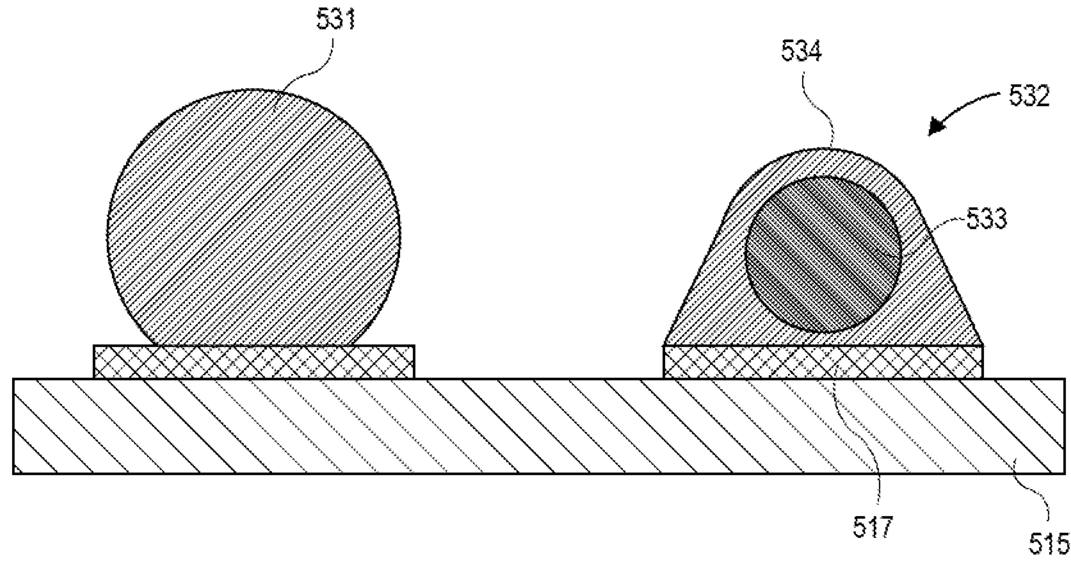
FIG. 5C is a cross-sectional illustration of a first solder ball and a second solder ball, where the second solder ball comprises a core, in accordance with an embodiment.

Referring now to FIG. 5C, a cross-sectional illustration of a first solder ball 531 and a second solder ball 532 is shown, in accordance with an embodiment. In an embodiment, the first solder ball 531 may have a composition that is substantially all solder and the second solder ball 532 may be a cored solder ball that comprises a core 533 and solder 534 surrounding the core 533. In an embodiment, the core 533 may be a non-solder material. For example, the core 533 may comprise copper, nickel, polymeric materials, or a polymeric material coated by copper or nickel. In an embodiment, the solder 534 surrounding the core 533 may be substantially the same solder composition as the solder in the first solder ball 531.

Figure 5D:
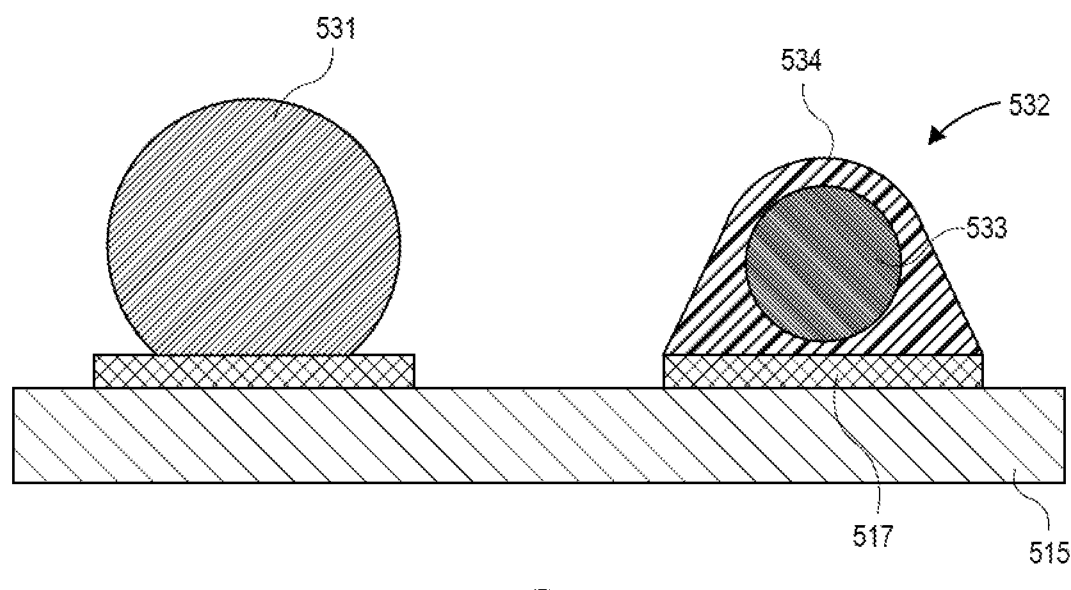
FIG. 5D is a cross-sectional illustration of a first solder ball and a second solder ball, where the second solder ball comprises a core and a solder composition different than the solder composition of the first solder ball, in accordance with an embodiment.

Referring now to FIG. 5D, a cross-sectional illustration of a first solder ball 531 and a second solder ball 532 is shown, in accordance with an embodiment. In an embodiment, the second solder ball 532 in FIG. 5D may be substantially similar to the second solder ball 532 in FIG. 5C, with the exception that the solder 534 is a different material composition than the solder of the first solder ball 531.

Figure 6:
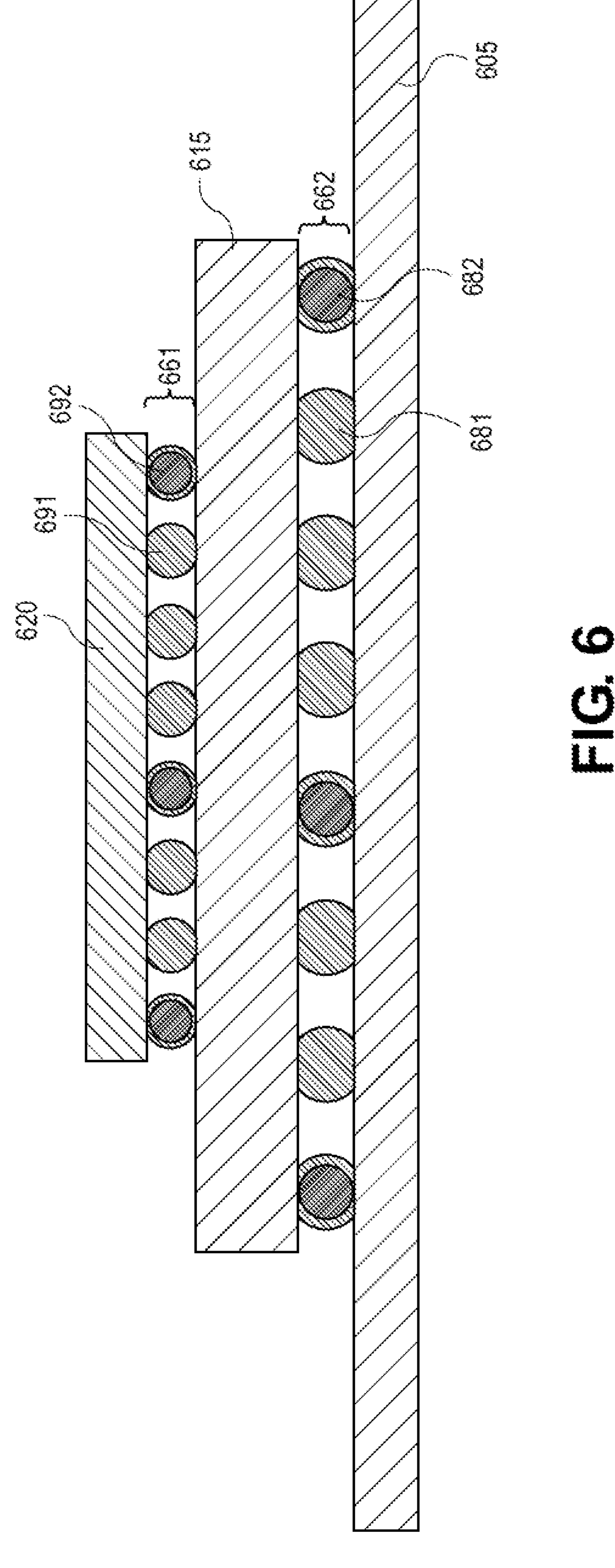
FIG. 6 is a cross-sectional illustration of an electronic system that comprises first level interconnects and second level interconnects, where the first level interconnects and the second level interconnects both comprise first solder balls and second solder balls, in accordance with an embodiment.

Referring now to FIG. 6, a cross-sectional illustration of an electronic system 670 is shown, in accordance with an embodiment. The electronic system 670 may comprise a plurality of substrates that are coupled together by different levels of interconnects. For example, the electronic system 670 may comprise a first substrate 605, a second substrate 615, and a third substrate 620. First level interconnects 661 may couple the third substrate 620 to the second substrate 615, and second level interconnects 662 may couple the second substrate 615 to the first substrate 605. In an embodiment, each interconnect level 661/662 may comprise variable interconnect architectures. For example, the first interconnect level 661 comprises first interconnects 691 and second interconnects 692, and the second interconnect level 662 comprises third interconnects 681 and fourth interconnects 682. The first interconnects 691 are different than the second interconnects 692, and the third interconnects 681 are different than the fourth interconnects 682.

In a particular embodiment, the third substrate 620 is a semiconductor die, the second substrate 615 is a package substrate, and the first substrate 605 is a board. However, it is to be appreciated that variable solder ball/interconnect architectures may be used for any interconnect architecture in many different electronic systems. For example variable solder ball/interconnect architectures may be used in die to package substrate attachments (e.g., first level interconnects (FLIs) such as the first interconnect level 661), die to patch attachments (e.g., package on interposer (PoINT) architectures), die to die attachments (e.g., logic to memory interconnects (LMI) or memory to memory interconnects (MMI)), or die to interposer attachments (e.g., architectures that are sometimes referred to as "2.5D stacking"). While a list of different architectures to which such variable solder ball/interconnect architectures may be beneficial is provided, it is to be appreciated that such interconnect architectures are suitable for many different electronic system architectures that include solder balls or which could be modified to use solder balls.

In the description above the cored solder balls are described as having a non-melting core over which a reflowable solder is disposed. However, it is to be appreciated that in some embodiments, the reflowable solder may be modified. For example, during one or more reflow processes, the solder around the core may be converted into an intermetallic compound (IMC) through diffusion with the core and/or pad. In such embodiments, the core may be covered by either a low-temperature solder (LTS) (e.g., Sn—Bi, Sn—In) or standard lead-free solders (e.g., SAC, SnAg, or SnCu), where all of the solder would be converted completely to IMC after ball attach reflow or during initial SMT process. Alternative embodiments may include high-temperature solder (e.g., Sn—Sb), which will form the joint through solid state diffusion, but will not melt through a 260° C. reflow. The rigid IMC-Cu structure (or high-melting point solder) will keep the package substrate firmly attached to the board, and also the package shape will be synchronized to that of the board. At high temperatures (e.g., 200° C. to 260° C.), the IMC covered joints would prevent the package from bending away from the board into a concave shape, thus preventing NCO defects in corner areas and SBB defects in the center. As such, yield is improved.

Figure 7:
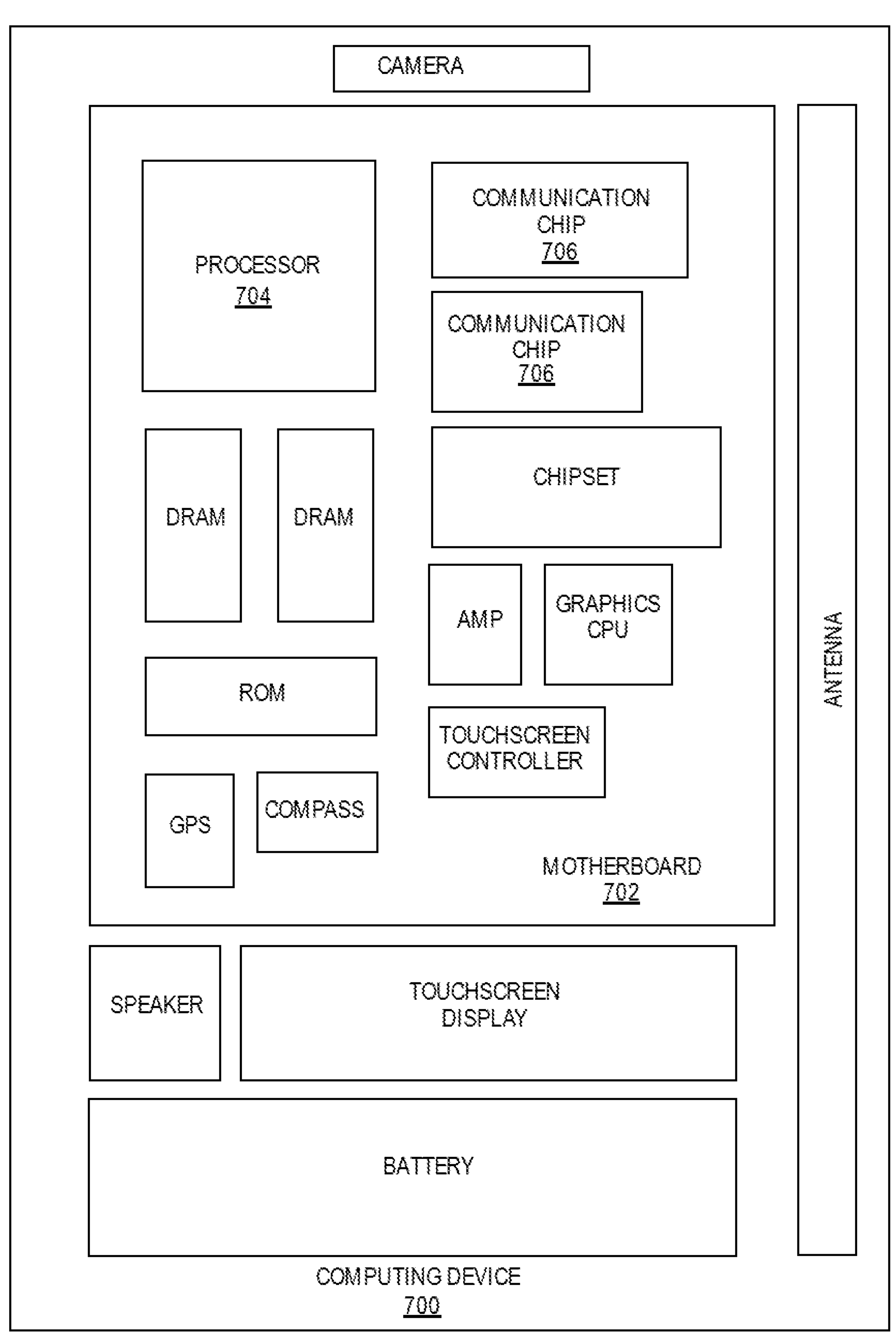
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor 704 may be part of an electronic package that comprises a variable interconnect architecture, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip 706 may be part of an electronic package that comprises a variable interconnect architecture, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a first substrate; a second substrate; and an array of interconnects electrically coupling the first substrate to the second substrate, wherein the array of interconnects comprises: first interconnects, wherein the first interconnects have a first volume and a first material composition; and second interconnects, wherein the second interconnects have a second volume and a second material composition, and wherein the first volume is different than the second volume and/or the first material composition is different than the second material composition.

Example 2: the electronic package of Example 1, wherein a number of first interconnects is greater than a number of second interconnects.

Example 3: the electronic package of Example 2, wherein the number of first interconnects is at least one-hundred times greater than the number of second interconnects.

Example 4: the electronic package of Examples 1-3, wherein one or more corner locations in the array of interconnects are each populated by second interconnects.

Example 5: the electronic package of Examples 1-4, wherein one or more center locations in the array of interconnects are each populated by second interconnects.

Example 6: the electronic package of Examples 1-5, wherein second interconnects are located at a non-critical-to-function (NCTF) pin, a redundant power pin, a redundant ground pin, or a non-connect location of the electronic package.

Example 7: the electronic package of Examples 1-6, wherein the second interconnects each comprise: a core; and solder surrounding the core.

Example 8: the electronic package of Example 7, wherein the core is a metallic material.

Example 9: the electronic package of Example 8, wherein the core comprises copper or nickel.

Example 10: the electronic package of Example 7, wherein the core is a polymeric material.

Example 11: the electronic package of Examples 1-10, wherein the first substrate is a package substrate, and wherein the second substrate is a board.

Example 12: the electronic package of Examples 1-10, wherein the first substrate is a package substrate, and wherein the second substrate is an interposer.

Example 13: the electronic package of Examples 1-10, wherein the first substrate is a die, and wherein the second substrate is a package substrate.

Example 14: an electronic package, comprising: a package substrate having a first surface and a second surface opposite from the first surface; a die attached to the first surface of the package substrate; an array of pads over the second surface of the package substrate; and a plurality of solder balls, wherein each solder ball is over one of the pads in the array of pads, and wherein the plurality of solder balls comprises: first solder balls; and second solder balls that are different than the first solder balls.

Example 15: the electronic package of Example 14, wherein the second solder balls each comprise: a core; and solder around the core.

Example 16: the electronic package of Example 15, wherein a thickness of the solder around the core is not uniform.

Example 17: the electronic package of claim 16, wherein the solder around the core comprises a fillet.

Example 18: the electronic package of Examples 14-17, wherein a height of the first solder balls is greater than a height of the second solder balls.

Example 19: the electronic package of Examples 14-18, wherein one or more corner pads of the array of pads are each covered by one of the second solder balls.

Example 20: the electronic package of Examples 14-19, wherein one or more center pads of the array of pads are each covered by one of the second solder balls.

Example 21: the electronic package of Examples 14-20, wherein the first solder balls have a first volume and a first material composition, wherein the second solder balls have a second volume and a second material composition, and wherein the first volume is different than the second volume and/or the first material composition is different than the second material composition.

Example 22: an electronic system, comprising: a first substrate; a second substrate attached to the first substrate by an array of first level of interconnects; and a third substrate attached to the second substrate by an array of second level of interconnects, wherein at least one of the array of first level interconnects and the array of second level interconnects comprises: first interconnects; and second interconnects, wherein a number of first interconnects is greater than a number of second interconnects.

Example 23: the electronic system of Example 22, wherein the first substrate is a die, wherein the second substrate is a package substrate, and wherein the third substrate is a printed circuit board (PCB).

Example 24: the electronic system of Example 22 or Example 23, wherein the second interconnects each comprise: a core; and solder around the core.

Example 25: the electronic system of Examples 22-23, wherein the second interconnects are located at corner locations and/or center locations of the array of first level interconnects and/or the array of second level interconnects.

What is claimed is:

1. An electronic system, comprising:

a first substrate;

a second substrate;

first solder balls coupling the first substrate to the second substrate, the first solder balls having a first total chemical composition comprising a metallic core surrounded by a solder, a first portion of the first solder balls aligned in a row proximate to a first edge of the second substrate, and a second portion of the first solder balls aligned in a row proximate to a second edge of the second substrate, the second opposite the first edge;

a third substrate; and second solder balls coupling the second substrate to the third substrate, the second solder balls having a second total chemical composition different than the first total chemical composition of the first solder balls.

2. The electronic system of claim 1, wherein the metallic core comprises copper.

3. The electronic system of claim 1, wherein the second solder balls comprises a solder material different than the solder of the first solder balls.

4. The electronic system of claim 1, wherein the third substrate has a lateral width greater than a lateral width of the second substrate.

5. The electronic system of claim 4, wherein the lateral width of the second substrate is greater than a lateral width of the first substrate.

6. The electronic system of claim 1, wherein the second substrate has a lateral width greater than a lateral width of the first substrate.

7. The electronic system of claim 1, wherein the third substrate is a board.

8. The electronic system of claim 7, wherein the second substrate is a package substrate.

9. The electronic system of claim 1, wherein the second substrate is a package substrate.

10. The electronic system of claim 1, further comprising:

third solder balls coupling the first substrate to the second substrate, the third solder balls having a third total chemical composition different than the first total chemical composition; and fourth solder balls coupling the second substrate to the third substrate, the fourth solder balls having a fourth total chemical composition different than the third total chemical composition.

11. An electronic system, comprising:

a first substrate;

a second substrate;

first solder balls coupling the first substrate to the second substrate, the first solder balls having a first total chemical composition;

a third substrate; and second solder balls coupling the second substrate to the third substrate, the second solder balls having a second total chemical composition different than the first total chemical composition of the first solder balls, and the second solder balls comprising a metallic core surrounded by a solder, a first portion of the first solder balls aligned in a row proximate to a first edge of the second substrate, and a second portion of the first solder balls aligned in a row proximate to a second edge of the second substrate, the second opposite the first edge.

12. The electronic system of claim 11, wherein the metallic core comprises copper.

13. The electronic system of claim 11, wherein the first solder balls comprises a solder material different than the solder of the second solder balls.

14. The electronic system of claim 11, wherein the third substrate has a lateral width greater than a lateral width of the second substrate.

15. The electronic system of claim 14, wherein the lateral width of the second substrate is greater than a lateral width of the first substrate.

16. The electronic system of claim 11, wherein the second substrate has a lateral width greater than a lateral width of the first substrate.

17. The electronic system of claim 11, wherein the second substrate is a package substrate.

18. The electronic system of claim 11, wherein the first substrate is a semiconductor die.

19. The electronic system of claim 18, wherein the second substrate is a package substrate.

20. The electronic system of claim 11, further comprising:

third solder balls coupling the first substrate to the second substrate, the third solder balls having a third total chemical composition different than the first total chemical composition; and fourth solder balls coupling the second substrate to the third substrate, the fourth solder balls having a fourth total chemical composition different than the third total chemical composition.

21. A package comprising:

a first substrate;

a second substrate;

an array of interconnects between the first substrate and the second substrate, the array of interconnects including a plurality of first interconnects and a plurality of second interconnects, each of the first interconnects including a first solder comprising tin, and each of the second interconnects comprising a copper core and a second solder surrounding the copper core, the second solder comprising tin, wherein each of the plurality of first interconnects has a first total chemical composition, and each of the plurality of second interconnects has a second total chemical composition different than the first total chemical composition; and wherein the array of interconnects includes corner regions and a middle, at least one of the second interconnects located in one of the corner regions and at least one of the first interconnects located in the middle.

22. The package of claim 21, wherein the copper core has a diameter of 250 um or less.

23. The package of claim 21, wherein a thickness of the second solder surrounding the copper core is approximately 1 um or greater.

24. The package of claim 21, wherein the array includes a perimeter and a portion of the perimeter comprises some of the second interconnects.

25. The package of claim 21, wherein the first solder further comprises at least one of silver and copper.

26. The package of claim 21, wherein the second solder further comprises at least one of bismuth, indium, silver, and copper.

27. The package of claim 21, wherein a material composition of the first solder is different than a material composition of the second solder.

28. The package of claim 22, wherein a height between the first substrate and the second substrate is equal to or greater than the diameter of the copper core.

29. The package of claim 21, wherein at least one of the second interconnects extends from the first substrate to the second substrate.

30. The package of claim 29, further comprising:

a first pad on the first substrate; and a second pad on the second substrate; and wherein one of the second interconnects is coupled with the first pad and the second pad.

31. The package of claim 29, wherein each of the first interconnects extends from the first substrate to the second substrate.

32. The package of claim 21, wherein a number of the first interconnects is greater than a number of second interconnects.

33. The package of claim 21, further comprising a semiconductor die over the second substrate.

34. A packaging, comprising:

a first substrate;

a second substrate;

an array of interconnects between the first substrate and the second substrate, the array of interconnects including a first interconnect, a second interconnect, a third interconnect, and a fourth interconnect, wherein each of the first interconnect and the second interconnect includes a first solder, and each of the third interconnect and the fourth interconnect includes a copper core having a diameter of 250 um or less, and a second solder surrounding the copper core, the second solder having a thickness approximately 1 um or greater, wherein each of the first interconnect and the second interconnect has a first total chemical composition, and each of the third interconnect and the fourth interconnect has a second total chemical composition different than the first total chemical composition; and wherein at least one of the third interconnect and the fourth interconnect is located at a perimeter of the array of interconnects, wherein at least one of the first interconnect and the second interconnect is located at a middle of the array of interconnects, and wherein at least one of the third interconnect and the fourth interconnect is located at a corner region of the array of interconnects.

35. The package of claim 34, wherein the first solder comprises tin and the second solder comprises tin.

36. The package of claim 35, wherein the first solder further comprises at least one of silver and copper.

37. The package of claim 35, wherein the second solder further comprises at least one of bismuth, indium, silver, and copper.

38. The package of claim 35, wherein a material composition of the first solder is different than a material composition of the second solder.

39. The package of claim 34, wherein a height between the first substrate and the second substrate is at least the diameter of the copper core.

40. The package of claim 34, wherein each of the third interconnect and the fourth interconnect extends from the first substrate to the second substrate.

41. The package of claim 40, further comprising:

a first pad on the first substrate; and a second pad on the second substrate; and wherein one of the third interconnect and the fourth interconnect is coupled with the first pad and the second pad.

42. The package of claim 40, wherein each of the first interconnect and the second interconnect extends from the first substrate to the second substrate.

43. The package of claim 34, wherein each of the first interconnect and the second interconnect have a first volume, and each of the third interconnect and the fourth interconnect have a second volume, the second volume different than the first volume.

44. The package of claim 34, further comprising a semiconductor die over the second substrate.

45. A packaging, comprising:

a first substrate;

a second substrate;

an array of interconnects between the first substrate and the second substrate, the array of interconnects including a plurality of first interconnects and a plurality of second interconnects, each of the first interconnects including tin, and each of the second interconnects comprising a copper core having a diameter of 250 um or less, and tin surrounding the copper core, wherein each of the plurality of first interconnects has a first total chemical composition, and each of the plurality of second interconnects has a second total chemical composition different than the first total chemical composition; and wherein a height between the first substrate and the second substrate is at least the diameter of the copper core, wherein the array comprises:

a corner region, wherein at least one of the second interconnects is located in the corner region; and a middle, wherein at least one of the first interconnects is located in the middle.

46. The package of claim 45, wherein a thickness of the tin surrounding the copper core is approximately 1 um or greater.

47. The package of claim 45, further comprising a semiconductor die over the second substrate.

48. The package of claim 45, further comprising:

a first pad on the first substrate; and a second pad on the second substrate; and wherein one of the second interconnects is coupled with the first pad and the second pad.

49. The package of claim 45, wherein each of the first interconnects extends from the first substrate to the second substrate.

50. The package of claim 45, wherein the array further comprises:

a periphery, wherein at least one of the second interconnects is located on the perimeter.

* * * * *